United States Patent [19]

Lapham, Jr. et al.

[11] 3,864,817

[45] Feb. 11, 1975

[54] METHOD OF MAKING CAPACITOR AND RESISTOR FOR MONOLITHIC INTEGRATED CIRCUITS

[75] Inventors: Jerome F. Lapham, Jr., Shrewsbury; John A. Mataya, Grafton, both of Mass.

[73] Assignee: Sprague Electric Co., North Adams, Mass.

[22] Filed: Aug. 3, 1973

[21] Appl. No.: 385,362

Related U.S. Application Data

[62] Division of Ser. No. 266,199, June 26, 1972, abandoned.

[52] U.S. Cl. ........................ 29/577, 29/578, 357/51, 357/59, 357/49

[51] Int. Cl. .............................................. B01j 17/00

[58] Field of Search ....... 29/577, 578, 576 O, 576 C

[56] References Cited

UNITED STATES PATENTS

| | | | |
|---|---|---|---|
| 3,519,901 | 7/1970 | Bean | 29/577 |
| 3,576,478 | 4/1971 | Watkins | 29/578 |
| 3,747,203 | 7/1973 | Shannon | 29/578 |

OTHER PUBLICATIONS

Integrated Electronics, Holden–Day Pub. Co., 1967, page 472, H. C. Lin.

*Primary Examiner*—Roy Lake
*Assistant Examiner*—W. C. Tupman
*Attorney, Agent, or Firm*—Connolly and Hutz

[57] ABSTRACT

A low-leakage metal-oxide-polycrystalline silicon capacitor is produced on a silicon wafer by a method that is compatible with normal monolithic integrated circuit fabrication. After the base and resistor diffusion step of normal integrated circuit fabrication, a polycrystalline silicon region is grown followed by deposition of a capacitor lower plate mask. Normal IC fabrication is then resumed to complete the manufacture of the unit. The polycrystalline silicon is doped heavily n-type during the process, thus avoiding depletion and inversion effects if the circuit is run with normal power supplies. The capacitor is electrically isolated from the rest of the chip by dielectric isolation techniques. Using the same techniques, compatible polycrystalline silicon resistors can be simultaneously fabricated on the same wafer.

4 Claims, 6 Drawing Figures

PATENTED FEB 11 1975 3,864,817

METHOD OF MAKING CAPACITOR AND RESISTOR FOR MONOLITHIC INTEGRATED CIRCUITS

CROSS REFERENCE TO RELATED APPLICATION

This is a division of application Ser. No. 266,199 filed June 26, 1972, and now abandoned.

BACKGROUND OF THE INVENTION

This invention relates to a method of making a capacitor and a reisitor for monolithic integrated circuits, and more particularly, to a metal-oxide-polycrystalline silicon capacitor and resistor that are compatible with monolithic integrated circuits.

Many operational amplifiers use a metal-oxide-semiconductor (MOS) capacitor for frequency compensation that is built as an integral part of the integrated circuit chip. Such a capacitor is typically isolated electrically from the rest of the chip by pn junction isolation techniques. However, the normal leakage associated with the isolation junction degrades the performance of the operational amplifier, particularly the offset drift as a function of temperature. Multilevel interconnect techniques have been used to overcome this problem. These techniques replace the pn junction isolation with dielectric isolation. However, standard dielectric isolation techniques are too cumbersome to be used for only this purpose. The simpler forms of multilevel interconnect suffer from complexity and reliability, particularly step coverage. When deposited oxides are used as the dielectric, the pyrolytic or sputtered oxide tends to bead along the edges of the freshly etched metal surface, and microcracks appear at points where upperlevel metallization crosses these beads.

Similarly, the art would be advanced if it were possible to produce a low leakage resistor at the same time as the capacitor and on the same chip. Advantageously, such a resistor should be of small size and should also be compatible with normal monolithic integrated circuit fabrication.

Accordingly, it is an object of the present invention to provide a capacitor and resistor that are compatible with monolithic integrated circuits.

It is another object of this invention to provide such passive components that are built as an integral part of the integrated circuit chip and have low leakage characteristics.

It is a further object of the instant invention to provide a process, for making such components, that is compatible with normal integrated circuit fabrication and uses multilevel interconnect techniques while avoiding micro-cracks therein.

SUMMARY OF THE INVENTION

A monolithic operational amplifier chip has a metal-oxide-polycrystalline silicon capacitor built thereon, and the method of providing same is compatible with normal monolithic integrated curcuit fabrication. Preferably after the base and resistor diffusion step thereof, a polycrystalline silicon region is grown in a modified epitaxial reactor followed by deposition of a capacitor lower plate mask. The polycrystalline silicon is doped heavily n-type during the process, thus avoiding depletion and inversion effects if the circuit is run with normal power supplies. Using a silane process, a small grain size polycrystalline silicon having a reduced pinhole count can advantageously be used herein.

Normal IC fabrication is then resumed to complete the manufacture of the unit. The capacitor produced is electrically isolated from the rest of the chip by dielectric isolation and multi-level interconnect techniques, and microcracking of metal interconnects on the deposited oxides is avoided. Low leakage and compatible resistors can also be simultaneously fabricated using this process.

DESCRIPTION OF THE PREFERRED EMBODIMENT

Figure 1:
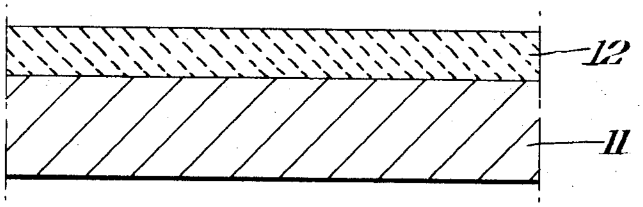
FIGS. 1–4 are sectional views of a silicon wafer illustrating successive steps in the fabrication of the capicitor of this invention.

As shown in FIG. 1, a single crystal silicon wafer 11 is formed in any conventional manner. The wafer 11 is made to have a resistivity of approximately 3–15 ohm-cm. and is of one conductivity type, such as p-type silicon. A dielectric silicon dioxide coating 12 is formed to a thickness of about 12,000 angstroms over at least one major surface of the wafer 11. This can be accomplished, for example, by firing wafer 11 at about 1,100°C for approximately 20 hours in a quartz tube furnace and in a relatively pure oxygen atmosphere or the like.

While the drawings and description herein are directed toward the fabrication of a single device, it should be understood that the process described herein may be employed using a rather large wafer of silicon upon which is fabricated a multiplicity of individual devices both active and passive devices.

As in normal IC fabrication, a mask for opening windows for an $n+$ buried layer is then performed, and an $n+$ diffusion is carried out through the window to the p-type material in a conventional manner. The $Si0_2$ layer is then removed and an n-type epitaxial layer is grown thereon. Another $Si0_2$ layer is then grown on top of the epitaxial layer, and is followed by conventional masking and diffusion steps for forming an isolation frame. A masking operation for base and any resistor diffusion is then performed followed by the base and resistor diffusion itself.

Figure 2:
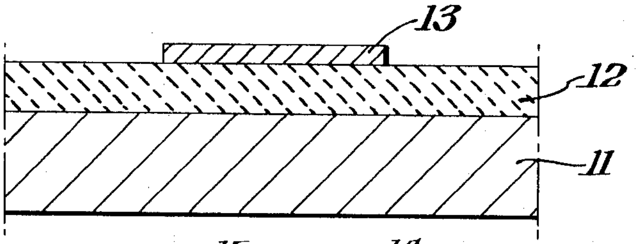

At this point in the manufacture of normal monolithic integrated circuits, the capacitor of this invention may be formed on the same silicon wafer with only two additional steps. In FIG. 2, the silicon wafer 11 has the dielectric $Si0_2$ Layer 12 formed thereon. A polycrystalline silicon layer 13 is grown on a portion of the dioxide layer 12 to a thickness of 1,000 A – 10,000 A, and preferably to a thickness of approximately 4,000 angstroms (A). Since some polycrystalline silicon is consumed during the subsequent oxidation steps of the process, at least a 1,000 A thickness should be grown to insure that a complete layer of polycrystalline silicon remains thereon. No more than 10,000 A should be grown, inasmuch as more than this amount produces a diminishing return of beneficial effects. A masking and etching step is then carried out to delineate the lower plate for the capacitor. The wafer is then emitter masked and diffused for forming a transistor. This step could also be performed prior to isolation mask, or prior to base and resistor mask. Capacitors thusly formed would have typically thicker dielectrics and therefore typically lower capacitance and higher breakdown voltages.

Figure 3:
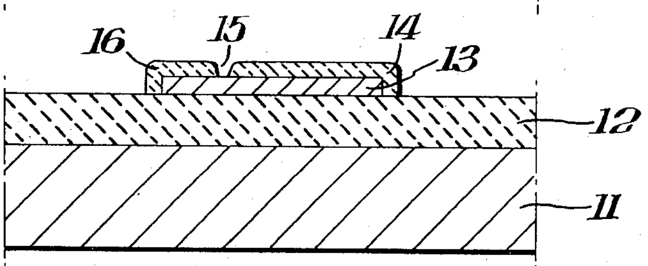

FIG. 3 shows the second oxide layers 14 and 16 formed for the capacitor during the reoxidation that takes place during the emitter diffusion. The second oxide layer is formed so as to be in contact with the dielectric silicon dioxide around the entire periphery of the polycrystalline silicon. This oxide may also be formed by a pyrolytic oxidation deposition step. An opening 15 is shown thereon separating the oxide layers 14 and 16 that exposes the polycrystalline silicon for subsequent contacting by aluminum interconnects.

Figure 4:
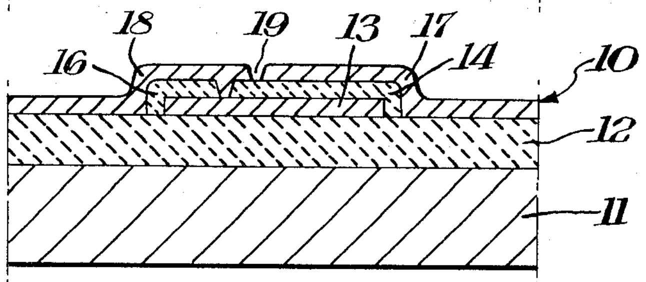

Contact masks are performed to provide for contacts to the various elements of the circuit. A metallization can be put down at this point that electrically ties the elements together and provides electrical contact therefor to the outside. The metallization provides for an ohmic contact to the polycrystalline silicon. FIG. 4 shows the completed capacitor 10 of this invention wherein aluminum has been evaporated thereon. The aluminum layer 18 contacts the polycrystalline silicon 13 and forms the lower plate of the capacitor, while the top electrode therefor is formed by the aluminum layer 17. The electrodes to the capacitor are spaced apart and are electrically isolated from each other by opening 19 in the aluminum. While aluminum is used in this metallization step, it should be emphasized that any metallization system commonly used by those skilled in the art on silicon substrated integrated circuits can be used herein, such as a composite of platinum, titanium and gold.

Figure 5:
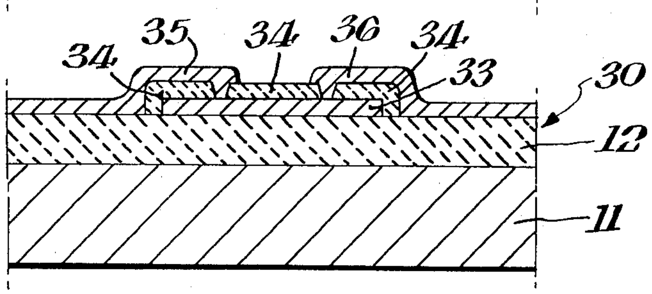
FIG. 5 is a sectional view of a polycrystalline silicon resistor of this invention.

FIG. 5 shows another embodiment of this invention wherein a resistor 30 can be simultaneously made on the silicon wafer 11. A dielectric $Si0_2$ layer 12 is formed on wafer 11, upon which a polycrystalline silicon 33 can be grown, simultaneously with the growth of the polycrystalline silicon 13 for capacitor 10. A second layer of oxide 34 is then formed so as to be in contact with the dielectric silicon dioxide around the entire periphery of the polycrystalline silicon. Openings are made on this second oxide layer 34 so as to expose the polycrystalline silicon 33 for subsequent contacting by spaced apart aluminum electrodes at 35 and 36, thus completing the formation of the resistor 30.

These resistors offer the same major advantages as the capacitor of this invention, that is low leakage to the substrate, as they too are dielectrically isolated instead of being pn junction isolated.

Other advantages include the relatively small size and compatibility of the resistors. The resistance of these resistors is determined by the sheet resistance of the polycrystalline film 33, which can be varied over a very wide range, depending on the sheet resistance of the diffusion and thickness of the film. The sheet resistance could also be controlled by doping the polycrystalline silicon during deposition, and subsequently oxidizing it until it is no longer possible to diffuse through the oxide. Sheet resistivities of up to 500,000 ohms per square can be attained using this approach. These resistors can advantageously be made in the same manner as, and simultaneously with, the aforedescribed compatible capacitor.

Figure 6:
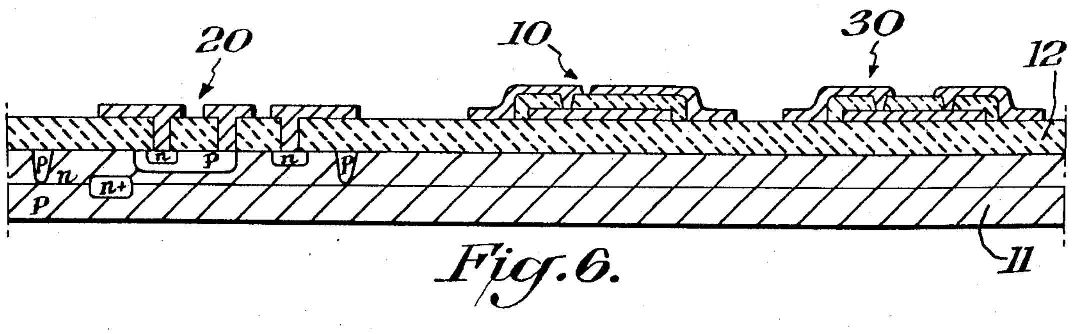
FIG. 6 is a sectional view of a portion of a monolithic integrated circuit having a transistor thereon, together with the resistor and the capacitor of this invention.

An interconnect mask provides for the openings on the components and further separates the various elements of the circuit as shown in FIG. 6. This figure shown an npn transistor 20 separated from the capacitor 10, and the resistor 30 of this invention wherein the silicon wafer 11 has the dielectric oxide layer 12 thereon. This oxide layer 12 has polycrystalline silicon thereon, to form the capacitor and resistor, that is substantially covered by oxide layers which are separated from each other on each component by an opening or window therein that permits aluminum to contact the polycrystalline silicon layer thereby forming the capacitor 10 and the resistor 30. An interconnect mask separates the transistor from the capacitor 10 and resistor 30, and any other elements made on the circuit. The contacts are then sintered at approximately 450°–550° C to complete the units.

It should be emphasized that when the polycrystalline silicon is grown, it is doped heavily n-type, a dopant concentration of $10^{17}$ atoms/cc to $10^{21}$ atoms/cc, during the process producing a good ohmic contact for a subsequent metallization. Also depletion and inversion effects, which strongly affect the capacitance value, are avoided if the circuit runs with normal power supplies, for example, 25 volts. If the polycrystalline silicon were not doped, or were doped too lightly, inversion would occur at fairly low voltages and severely reduce the capacitance of the unit. If the polycrystalline were doped too heavily (greater than $10^{21}$ atoms/cc) then the dopant would start to precipitate out of the polycrystalline material. A typical n-type copant would be phosphorous. The polycrystalline silicon may advantageously be grown in a relatively small grain size in a modified epitaxial reactor by passing silane, SiH4, over the wafer to achieve a thickness of approximately 4,000 A. The wafer is exposed to 50 $cm^3$/minutes of SiH4 and 40,000 $cm^3$/minutes of nitrogen for 5½ minutes at about 675°C. The tube area thereof was about 83 $cm^2$ (semi-rectangular). The relatively small grain size polycrystalline silicon grown herein advantageously gives a reduced pinhole count.

The aluminum metallization used herein has a thickness of approximately 10,000 A, and was evaporated cold, although hot evaporations are entirely satisfactory.

The use of dielectric isolation techniques herein to electrically isolate the capacitor and/or resistor from the rest of the chip greatly reduces the normal leakage associated with pn junction isolation techniques. The dielectric in this process can be a phosphosilicate glass grown and deposited during emitter diffusion. This material is the common insulator found in the "normal" MOS compatible capacitor.

It should be understood that other methods for obtaining the $Si0_2$ layer are within the scope of this invention; e.g., direct deposition of silicon dioxide by evaporation; the evaporation of silicon monoxide onto a substrate followed by oxidation of the deposit to silicon dioxide; or the pyrolytic deposition of silicon dioxide, e.g. from $SiH_4$ and $0_2$.

The above-described specific embodiment of the invention has been set forth for the purposes of illustration. It will be apparent to those skilled in the art that various modifications may be made in the composition of the capacitor and circuit of this invention without departing from the principles of this invention as pointed out and disclosed herein. For that reason, it is not intended that the invention should be limited other than by the scope of the appended claims.

What is claimed is:

1. A method of making a planar monolithic integrated circuit having a bipolar NPN transistor and a compatible capacitor, said method comprising growing an epitaxial N-type silicon layer on a P-type silicon substrate, producing a P-type base region within said epitaxial layer at a surface thereof, covering said epitaxial layer and said base region with a dielectric silicon dioxide layer, growing a polycrystalline silicon capacitor plate on a portion of said dielectric layer laterally spaced from said base region, diffusing N-type imparting material into said base region to form an emitter region and into said polycrystalline plate to dope said plate heavily N-type, providing a silicon oxide covering over said plate, contacting said plate through said oxide covering, and depositing a second capacitor plate over said oxide covering.

2. The method of claim 1 wherein said polycrystalline silicon capacitor plate is doped in the range of $10^{17}$ to $10^{21}$ atoms/cc.

3. The method of claim 1 wherein said polycrystalline silicon capacitor plate has a thickness in the range of 1000 A to 10,000 A.

4. The method of claim 1 wherein said growing step also produces a resistor plate laterally spaced from said base region and said capacitor plate, and wherein said diffusing step, said providing step, said contacting step, and said depositing step produce spaced contacts through said oxide covering to said resistor plate.

* * * * *